United States Patent
Koide et al.

(10) Patent No.: US 8,194,205 B2
(45) Date of Patent: Jun. 5, 2012

(54) ELECTRO-OPTICAL DEVICE, LIGHT RECEIVING DEVICE, AND ELECTRONIC APPARATUS

(75) Inventors: Shin Koide, Chin (JP); Hiroko Muramatsu, Yokohama (JP); Shin Fujita, Suwa (JP)

(73) Assignee: Sony Corporation, Tokyo (JP)

( * ) Notice: Subject to any disclaimer, the term of this patent is extended or adjusted under 35 U.S.C. 154(b) by 1063 days.

(21) Appl. No.: 11/704,196

(22) Filed: Feb. 9, 2007

(65) Prior Publication Data

US 2007/0200971 A1    Aug. 30, 2007

(30) Foreign Application Priority Data

Feb. 14, 2006   (JP) ................. 2006-036083

(51) Int. Cl.
  *G02F 1/1333*   (2006.01)
  *G02F 1/1335*   (2006.01)
(52) U.S. Cl. ............ 349/62; 349/113; 349/162
(58) Field of Classification Search .......... 349/61–67, 349/113, 162
  See application file for complete search history.

(56) References Cited

U.S. PATENT DOCUMENTS

| | | | | |
|---|---|---|---|---|
| 5,051,570 A | * | 9/1991 | Tsujikawa et al. | 250/201.1 |
| 5,301,048 A | * | 4/1994 | Huisman | 349/24 |
| 5,831,693 A | * | 11/1998 | McCartney et al. | 349/42 |
| 6,069,674 A | * | 5/2000 | Aomori et al. | 349/12 |
| 7,110,062 B1 | * | 9/2006 | Whitted et al. | 349/68 |
| 7,218,048 B2 | | 5/2007 | Choi et al. | |
| 2002/0074551 A1 | * | 6/2002 | Kimura | 257/72 |
| 2003/0197817 A1 | * | 10/2003 | Class-Dieter et al. | 349/61 |
| 2004/0169786 A1 | * | 9/2004 | Yamazaki et al. | 349/61 |
| 2006/0103775 A1 | * | 5/2006 | Chung | 349/58 |
| 2007/0103853 A1 | * | 5/2007 | Kao | 361/681 |

FOREIGN PATENT DOCUMENTS

| | | |
|---|---|---|
| JP | A 2000-122575 | 4/2000 |
| JP | A 2003-78838 | 3/2003 |
| JP | A 2004-78160 | 3/2004 |
| JP | A 2005-70065 | 3/2005 |
| JP | A 2005-121997 | 5/2005 |
| JP | A 2005-122187 | 5/2005 |

OTHER PUBLICATIONS

Y. Tomihari et al., "A Low Temperature Poly-Si TFT Liquid Crystal Light Value (LCLV) with a Novel Light-Shielding Structure for High Performance Projection Displays," SID 04 Digest, pp. 972-975, 2004.

* cited by examiner

*Primary Examiner* — Mark Robinson
*Assistant Examiner* — Jerry Blevins
(74) *Attorney, Agent, or Firm* — K&L Gates LLP (57) ABSTRACT

An electro-optical device includes a transparent substrate, a PIN type diode formed in the transparent substrate and receiving light introduced through a light receiving side surface of the transparent substrate, and a reflecting portion provided on a surface side opposite to the light receiving side surface of the transparent substrate and for reflecting light passed through the transparent substrate to the PIN type diode.

14 Claims, 8 Drawing Sheets

ELECTRO-OPTICAL DEVICE, LIGHT RECEIVING DEVICE, AND ELECTRONIC APPARATUS

BACKGROUND

1. Technical Field

The present invention relates to an electro-optical device, a light receiving device, and an electronic apparatus which are preferable for a display equipment or the like for performing control of display luminance.

2. Related Art

A liquid crystal panel is constructed by enclosing liquid crystal between two substrates such as a glass substrate, a quartz substrate or the like. An electrode is provided on each substrate and an image signal is supplied to the electrodes. Optical property of liquid crystal positioned between electrodes of each substrate changes in accordance with the image signal. That is, alignment of liquid crystal molecules is changed by applying a voltage to the liquid crystal positioned between electrodes of each substrate based on the image signal. Thereby transmittance of light in each pixel is changed in accordance with the image signal and image display in accordance with the image signal is performed.

In order to perform high luminance display in such a liquid crystal panel, a backlight is generally provided on the back side of the liquid crystal panel. As for such a backlight, a device in which uniformity of illumination is improved by using a light guide plate has also been developed. Display on a display region can be observed at sufficient luminance by illuminating the display region of the liquid crystal panel with the backlight.

Incidentally, viewability of display of the liquid crystal panel is varied in accordance with brightness of periphery. For example, as the brightness of surrounding light becomes brighter, good viewability can be obtained as the illumination of the display region is increased. On the contrary, when surrounding light is sufficiently dark, it is not necessary to illuminate the display area beyond necessity.

In JP-A-2003-78838 (hereinafter, referred to as Patent Document 1), a technique is disclosed in which surrounding light is detected and luminance of a backlight is controlled with the feedback information thereof in order to provide good viewability regardless of brightness of the periphery.

In the device in Patent Document 1, as for an optical sensor for detecting surrounding light (outside light), a discreet component is employed. Accordingly, the optical sensor needs to be implemented on a flexible print substrate, causing increased number of man-hour and cost.

Consequently, it is preferable that an optical sensor using a PIN type diode is formed on a substrate constituting a display panel such as a liquid crystal panel or the like. In this case, the PIN type diode is formed on the same layer as a semiconductor layer in a viewing area.

However, in the semiconductor layer in the viewing area, a gate electrode needs to be formed on the semiconductor layer in order to form a self aligned LDD structure. In order to prevent injecting an impurity into an intrinsic layer, a mask of conductive material (hereinafter, referred to as mask conductive layer) needs to be formed on the intrinsic layer and in the same layer as the gate electrode also in a PIN type diode formed region. When the mask conductive layer is remaining on the intrinsic layer, introduction of light to the intrinsic layer is restricted by the mask conductive layer, so that sufficient light sensitivity can not be obtained. Consequently, in the PIN type diode formed region, it is required to provide a process for removing the mask conductive layer, so that there is a problem in that the number of processes is increased.

SUMMARY

An advantage of some aspects of the invention is that it provides an electro-optical device, a light receiving device, and an electronic apparatus which make it possible to obtain sufficient light sensitivity by allowing effective introduction of light into an intrinsic layer without removing a mask conductive layer.

An electro-optical device according to the invention includes a transparent substrate, a PIN type diode formed in the transparent substrate and receiving light introduced through a light receiving side surface of the transparent substrate, and a reflecting portion provided on a surface side opposite to the light receiving side surface of the transparent substrate and for reflecting light passed through the transparent substrate to the PIN type diode.

With such a conoptical figuration, the PIN diode is formed in the transparent substrate and receives the light introduced through the light receiving side surface of the transparent substrate. A part of the light introduced into the transparent substrate passes through the transparent substrate. The reflecting portion is provided at the surface side opposite to the light receiving side surface of the transparent substrate, so that the light passed through the transparent substrate is reflected to the PIN type diode side. Consequently, most of the light introduced from the light receiving side surface of the transparent substrate can be introduced into the PIN type diode, which enables to detect outside light at high sensitivity.

Further, an electro-optical device according to the invention includes a display panel including a first and a second transparent substrates oppositely disposed and a PIN type diode formed in the second transparent substrate and for detecting illuminance of light introduced form a light receiving side surface of the fist transparent substrate and introduced through a light receiving surface side of the second transparent substrate, a lighting unit provided at a surface side opposite to the light receiving surface side of the second transparent substrate and for illuminating light to the display panel, and a reflecting portion provided at the surface side opposite to the light receiving side surface of the second transparent substrate and for reflecting light passed through the transparent substrates to the PIN type diode.

With such a configuration, the display panel is constructed by the first and the second substrates oppositely disposed and the PIN type diode is formed in the second transparent substrate. The light introduced form the light receiving side surface of the first transparent substrate is introduced into the second transparent substrate through the light receiving side surface of the second transparent substrate to be received by the PIN type diode. A part of the light introduced through the light receiving surface side of the second transparent substrate passes through the second transparent substrate. The reflecting portion is provided on the surface side opposite to the light receiving side surface of the second transparent substrate. The light passed through the second transparent substrate is reflected by the reflecting portion to be introduced into the PIN type diode. Consequently, most of the light introduced from the light receiving side surface of the first transparent substrate can be introduced into the PIN type diode, which enables to detect outside light at high sensitivity.

Further, according to an aspect of the invention, a mask conductive layer is formed on an intrinsic layer constituting the PIN type diode in the PIN type diode.

With such a configuration, during manufacturing, with the mask conductive layer, introduction of impurities into the intrinsic layer constituting the PIN type diode is prevented. On the other hand, during light receiving, the light introduced from the light receiving side surface is difficult to be introduced into the intrinsic layer. Even in this case, the light passed through the second transparent substrate is reflected with the reflecting portion to be introduced into the intrinsic layer of the PIN type diode, so that the PIN type diode can detect illuminance of outside light at high sensitivity.

Further, according to an aspect of the invention, the reflecting portion is provided in a frame body holding the lighting unit.

With such a configuration, the frame body can be provided with a relatively simple task, so that high sensitivity outside light detection is possible with a simple configuration.

Further, according to an aspect of the invention, the reflecting portion includes a light shielding unit for shielding light from the lighting unit and a reflecting unit for reflecting light passed through the second transparent substrate to the PIN type diode.

With such a configuration, the light from the lighting unit is shield by the light shielding unit, so that the light from the light lighting unit is prevented to be introduced into the PIN type diode, so that illuminance of outside light can be correctly detected with the PIN type diode.

Further, according to an aspect of the invention, the reflecting portion is provided on a surface opposite to the light receiving side surface of the second transparent substrate.

With such a configuration, the reflecting portion can be provided on the surface opposite to the light receiving side surface of the second transparent substrate with a relatively simple task.

Further, according to an aspect of the invention, the PIN type diode is provided in a region in which the fist and second transparent substrates are opposed.

With such a configuration, the region in which the first and second transparent substrates are opposed is a display region, so that outside light can be introduced. Accordingly, by providing the PIN type diode in the region, a structure for introducing the light into the PIN type diode can be easily established.

Further, according to an aspect of the invention, the PIN type diode is provided in a region in which the fist and second transparent substrates are not opposed.

With such a configuration, the region in which the first and second transparent substrates are opposed to each other is a display region, so that light from the lighting unit is introduced. Accordingly, by providing the PIN type diode except the region, the light from the lighting unit is prevented to be introduced into the PIN type diode, so that illuminance of outside light can be correctly detected.

A light receiving device according to the invention includes a transparent substrate, a PIN type diode formed in the transparent substrate and receiving light introduced through a light receiving side surface of the transparent substrate, and a reflecting portion provided on a surface side opposite to the light receiving side surface of the transparent substrate and for reflecting light passed through the transparent substrate to the PIN type diode.

With such a configuration, the PIN diode is formed in the transparent substrate and receives the light introduced through the light receiving side surface of the transparent substrate. A part of the light introduced into the transparent substrate passes through the transparent substrate. The reflecting portion is provided at the surface side opposite to the light receiving side surface of the transparent substrate, so that the light passed through the transparent substrate is reflected to the PIN type diode side. Consequently, most of the light introduced from the light receiving side surface of the transparent substrate can be introduced into the PIN type diode, which enables to detect outside light at high sensitivity.

Further, an electronic apparatus according to the invention includes the electro-optical device described above.

With such a configuration, outside light can be detected at high sensitivity, which makes it possible to optimize displaying in accordance with illuminance of outer light, and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
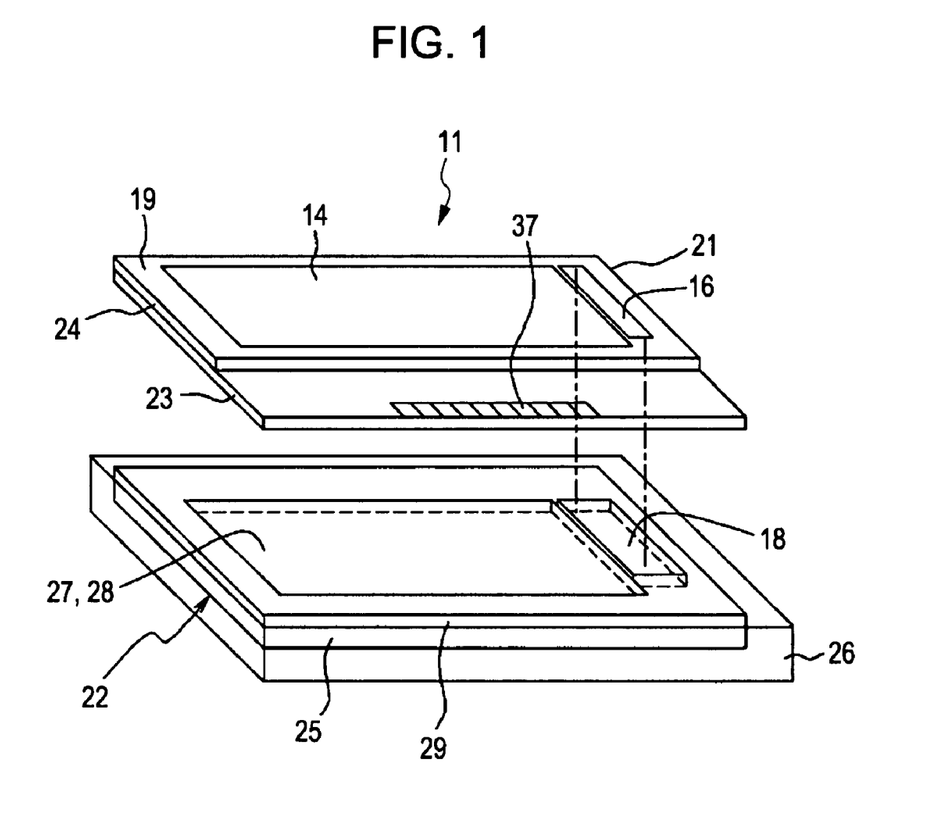
FIG. 1 is a perspective view schematically showing an electro-optical device according to a fist embodiment of the invention.
Figure 2:
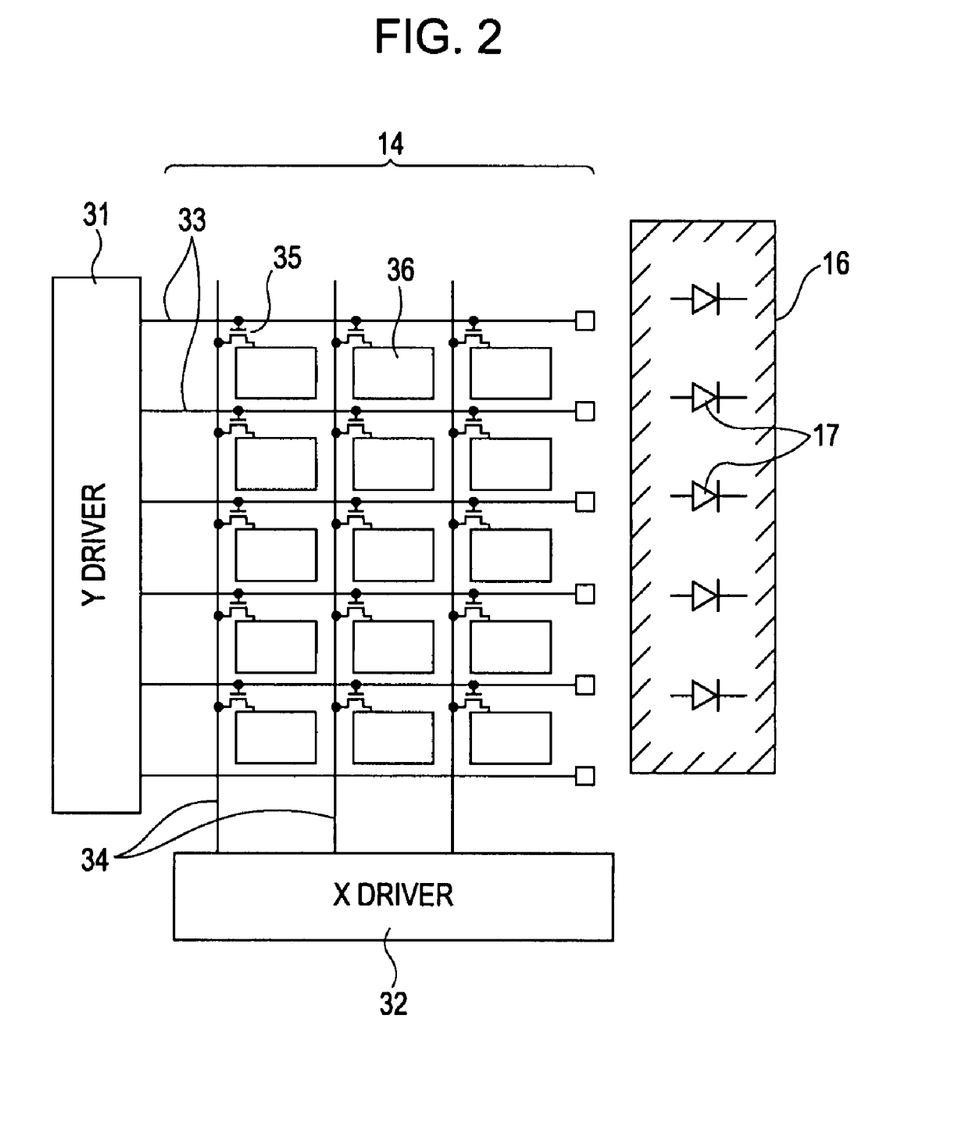
FIG. 2 is an equivalent circuit diagram of a display panel employed in the electro-optical device in FIG. 1.
Figure 3:
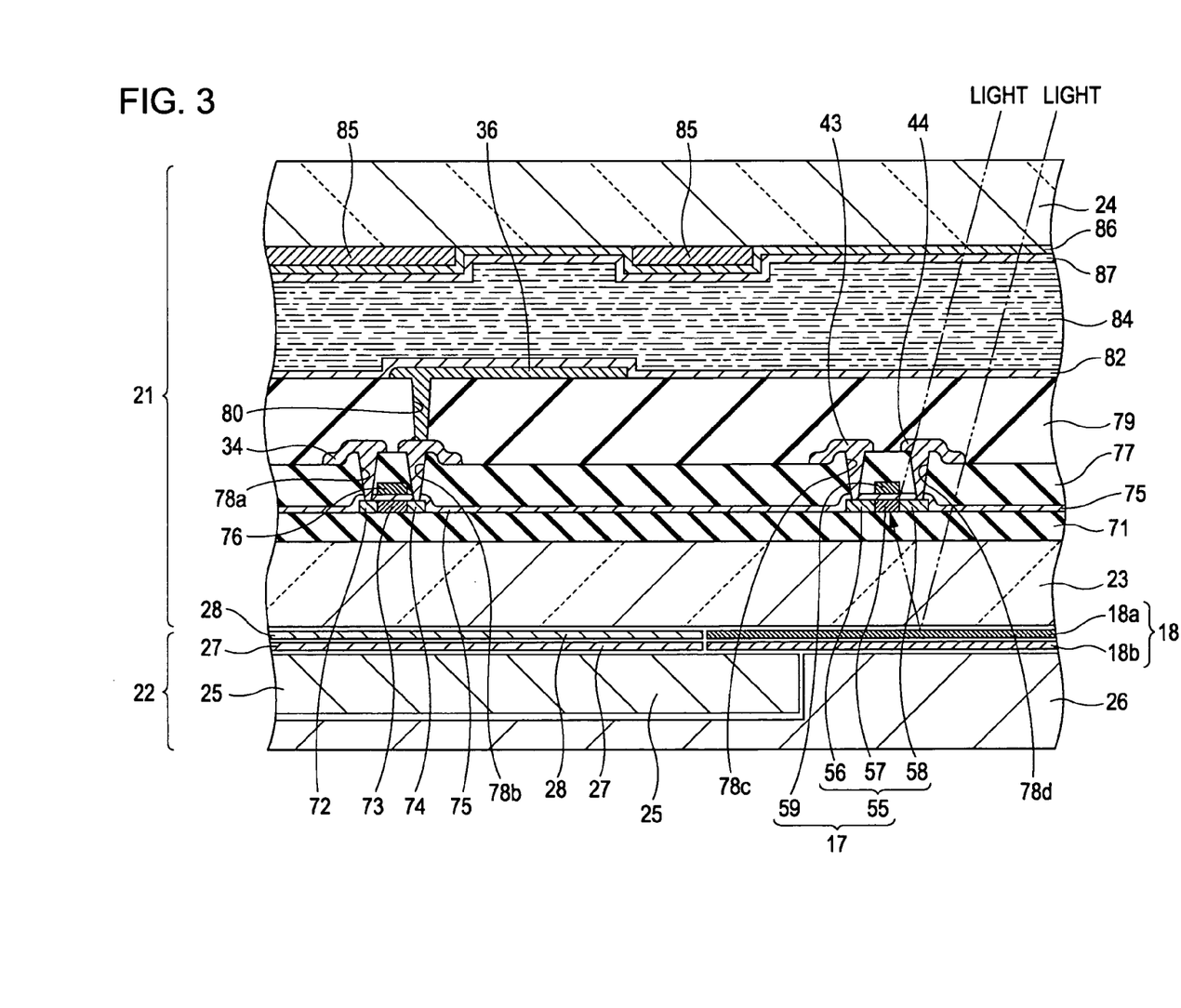
FIG. 3 is a cross sectional view showing a cross sectional structure of a liquid crystal panel embedded in an outer frame when the liquid crystal panel is employed as the electro-optical device in FIG. 1.

Hereinafter, embodiments of the invention will be described with reference to the accompanying drawings. FIG. 1 is a perspective view schematically showing an electro-optical device according to a first embodiment of the invention. FIG. 2 is an equivalent circuit diagram of a display panel employed in the electro-optical device in FIG. 1. FIG. 3 is a cross sectional view of the electro-optical device showing a cross sectional structure in which a liquid crystal panel is embedded in an outer frame in the case where the liquid crystal panel is employed as the electro-optical device in FIG. 1.

First Embodiment

In FIGS. 1 and 2, the electro-optical device 11 is constructed by a display panel 21 constructed by sticking two substrates together. When a liquid crystal panel is employed as the display panel 21, as shown in FIG. 1, the electro-optical device 11 includes a display panel 21 and a lighting unit 22. Note that a display panel of a self emission type may also be employed as for the electro-optical device. In this case, there is no need for the lighting unit 22.

Liquid crystal (not shown) is enclosed between an element substrate 23 and an opposing substrate 24 through which light is transmitted to construct the display panel 21. The oppositely disposed element substrate 23 and opposing substrate 24 are bonded with a seal member (not shown). The display panel 21 includes, for example, a plurality of scanning lines 33 (see FIG. 2) provided so as to extend in the lateral direction and a plurality of data lines 34 (not shown) provided so as to extend in the vertical direction in the viewing area 14. Further, a pixel is constructed so as to correspond with each of the intersections of the plurality of scanning lines 33 and the plurality of data lines 34.

A pixel electrode (ITO) 36 (see FIG. 2) constituting the pixel is disposed on the element substrate 23. Further, an opposing electrode (common electrode (ITO)) (not shown) is provided at the opposing substrate 24 side. An alignment layer being subjected to rubbing treatment (not shown) is provided on the pixel electrode 36 of the element substrate 23 so as to contact to the liquid crystal. On the other hand, an alignment layer being subjected to rubbing treatment (not shown) is provided at the opposing substrate 24 side so as to contact to the liquid crystal. Each alignment layer is formed of a transparent organic film such as a polyimide film or the like. Further, a light shielding film (not shown) is also formed along the data lines and the driving lines in the opposing substrate 24.

Note that a polarizer (not shown) is formed on each of the observation surface side of the opposing substrate 24 and the counter side of the element forming surface of the element substrate 23 (hereinafter, also referred to as light receiving side surface). Each of the polarizer is set at a polarizing axis corresponding to a rubbing direction of each of the alignment layers formed on the element substrate 23 and the opposing substrate 24.

The lighting unit 22 which functions as a backlight emits light from downside of the element substrate 23. The lighting unit 22 includes, for example, a plurality of light emitting diodes (hereinafter, referred to as LED) (not shown) which constitute a light source and a light guide plate 25. The light guide plate 25 is embedded in an outer frame 26. The light from the LED is introduced into the light guide plate 25, reflected and scattered at reflecting layers of the bottom surface the side surfaces of the light guide plate 25, and emitted from the upper surface of the light guide plate 25.

A diffusion sheet 27 and a prism sheet 28 are disposed on the upper surface of the light guide plate 25. The light from the light guide plate 25 is diffused by the diffusion sheet 27 and the prism sheet 28 to be emitted to the upper direction. The display panel 21 is to be disposed on the prism sheet 28.

Further, a light shielding plate 29 is also provided on the light guide plate 25. The light shielding plate 29 is provided on the edge portion of the light guide plate 25 so as to surround the diffusion sheet 27 and the prism sheet 28. The light from the light guide plate 25 is prevented to be introduced into the region except the viewing area 14 of the display panel 21 by the light shielding plate 29.

Y driver 31 and X driver 32 (omitted in FIG. 1) are provided at a peripheral part of the viewing area 14 in the element substrate 23. As shown in FIG. 2, the plurality of scanning lines 33 are provided so as to extend toward the viewing area 14 from Y driver 31 and the plurality of data lines 34 are provided so as to extend toward the viewing area 14 from X driver 32. A switching element 35 is provided in the element substrate 23 so as to correspond to each of the intersections of the scanning lines 33 and the data lines 34. The switching element 35 is ON-OFF controlled by a driving signal supplied from Y driver 31 to the scanning line 33. The switching element 35 turned to ON supplies an image signal supplied from X driver 32 to the data line 34 to the pixel electrode 36.

Note that a TFT liquid crystal panel is exemplified as the display panel 21 in FIG. 2. However, another active matrix display panel may similarly constitute the display panel 21 when the pixel in the viewing area 14 can be driven by the driver. A terminal unit 37 is provided at one side of the display panel 21. Y driver 31 and X driver are connected to the terminal unit 37 by wirings (not shown).

In the electro-optical device 11 constructed in such a manner, an image signal is supplied to the data line 34 of the display panel 21 and a scanning signal is supplied to the scanning line 33. Thereby, each pixel is driven based on the image signal and the transmittance thereof is changed. The light introduced from the lighting unit 22 to the display panel 21 is modulated in accordance with the image signal in the viewing area 14 of the display panel 14. Thereby, an image can be viewed by observing the viewing area 14 from the observation surface side of the opposing substrate 24. Note that a light shielding area 19 for shielding light at a surrounding portion of the opposing substrate 24 is provided in the opposing substrate 24. Shape and size of the viewing area 14 is regulated by the shielding area 19.

In the embodiment, a light receiving element disposed area 16 having an apertural portion for taking outside light into the element substrate 23 is provided in the light shielding area 19. A light receiving diode 17 of a PIN type constituting a light receiving unit is provided in the element substrate 23 in the light receiving element disposed area 16. Light from the observation surface side of the opposing substrate 24 is taken into the substrate through the apertural portion of the light shielding area 19 in the light receiving element disposed area 16. FIG. 2 shows that a plurality of light receiving diodes 17 are formed in the light receiving element disposed area 16.

The light receiving diode 17 enables to detect illuminance of introduced light and to output a detected result. For example, brightness control of the lighting unit 22 in accordance with the brightness of outside light is possible by using the detected result by the light receiving diode 17. For example, when it is detected that outside light is bright, the brightness of the lighting unit 22 is illuminated in accordance with the brightness of the outside light. Thereby, visibility of display can be improved.

In the embodiment, a reflecting portion 18 is provided in a part of a light shielding plate 29 constituting the lighting unit 22 at the position opposing the light receiving element disposed area 16 of the display panel 21. In the example in FIG. 1, an apertural portion is provided in a part the light shielding plate 29 and the reflecting portion 18 is provided at the apertural portion. Outside light from the observation surface (light receiving surface) of the opposing substrate 24 is to be introduced into the reflecting portion 18 through the opposing substrate 24 and the element substrate 23. The reflecting portion 18 is made of, for example, a mirror, an aluminum foil, a metal plate, or the like and can be extremely easily constructed. The reflecting portion 18 reflects the light passed through the substrates 24 and 23 so as to introduce the reflected light to the light receiving diode 17. The light introduced through the apertural portion provide in the light shielding area 19 of the opposing substrate 24 is mainly introduced to the reflecting portion 18.

Note that a light shielding plate may be provided at the bottom surface of the reflecting portion 18 to prevent the introduction of the light to the light receiving diode 17 from the light guide plate 25 provided at the downside of the reflecting portion 18.

FIG. 3 shows an example of a cross section structure of a portion of the electro-optical device 11. FIG. 3 shows a cross section of a portion of the viewing area 14 and a portion of the light receiving element disposed area 16 in FIG. 2. Note that, a TFT liquid crystal panel is shown in FIG. 3 as an example of the display panel 21.

In the display panel 21, a foundation insulating film 71 is formed on the transparent substrate 23 such as a quartz substrate, a glass substrate, or the like. A semiconductor layer 73 constituting a TFT which is a switching element is formed on the foundation insulating film 71 in the viewing area 14. The semiconductor layer 73 is made of polysilicon as a polycrystalline semiconductor. Note that the polysilicon is formed by crystallization by laser anneal of amorphous silicon as an amorphous semiconductor which is non-single crystal semiconductor.

An impurity is introduced into the both ends of the semiconductor layer 73 to form a source region 72 and a drain region 74. A gate electrode 76 is formed on the semiconductor layer 73 through an oxidized film 75. The gate electrode 76 has, for example, two layers structure in which upper layer is molybdenum and lower layer is aluminum and connected to the scanning line 33.

The source region 72 and the drain region 74 have an LDD structure. That is, the source region 72 and the drain region 74 have each a portion in which impurity concentration is relatively low in the vicinity of a channel region on the lower side of the gate electrode 76. In order to construct the LDD structure in the semiconductor layer 73, an impurity is injected into the semiconductor layer 73 two times in order to form a low concentrate region and a high concentrate region of the source region 72 and the drain region 74. In the first impurity injection, an impurity having high concentration is injected into the whole region of the source region 72 and the drain region 74. In the second impurity injection, an impurity having relatively low concentration is injected into the both end sides of the source region 72 and the drain region 74 using the gate electrode 76 as a mask.

An interlayer isolating film 77 is formed on the oxidized film 75 and each of contact holes 78a and 78b is formed on the corresponding one of the source region 72 and the drain region 74 in the interlayer isolating film 77. The source region 72 is connected to the data line 34 via the contact hole 78a.

An interlayer isolating film 79 is formed on a wiring layer in which the data line 34 is formed and on the interlayer isolating film 77. A contact hole 80 is formed in the interlayer isolating film 79 and the drain region 74 is connected to the pixel electrode 36 formed on the interlayer isolating film 79 via the contact holes 78b and 80.

On the other hand, a PIN type light receiving diode 17 is formed on the foundation insulating layer 71 in the light receiving element disposed area 16. The light receiving diode 17 is formed by the same manufacturing process as the TFT in the viewing area 14.

That is, the light receiving diode 17 has a P type region 56 in which P type impurity is introduced, a N type region 58 in which N type impurity is introduced, and an I type region 57 which is an intrinsic semiconductor or in which an extremely small amount of impurity is introduced in a semiconductor layer 55 formed by the same layer as the semiconductor layer 73. The P type region 56 and the N type region 58 each constitute the anode and the cathode of the light receiving diode 17.

An oxidized film 75 which is the same film as that of the viewing area 14 is formed on these areas 56 to 58. In the embodiment, a mask conductive layer 59 is formed on the oxidized film 75 on the light receiving diode 17. The mask conductive layer 59 is formed by the same process as that of the gate electrode 76 of the TFT and has two layers structure in which upper layer is molybdenum and lower layer is aluminum.

As described above, impurity introducing process is performed two times in order to constitute the LDD structure in the semiconductor layer 73 in the viewing area 14. The mask conductive layer 59 enables to prevent the introduction of the impurity having a low concentration into the I type region 57 in the second impurity introducing process.

Contact holes 78c and 78d are opened in the interlayer isolating film 77 on the P type region 56 and the N type region 58. Wirings 43 and 44 are formed on the interlayer isolating film 77 in the same layer as the data line 34 and each region 56 and 58 is connected to each wiring 43 and 44 via each contact hole 78c and 78d. Note that the wirings 43 and 44 have, for example, three layers structure in which titanium, aluminum, and titanium are laminated.

The interlayer isolating film 79 is formed on a wiring layer on the interlayer isolating film 77 and the interlayer isolating film 77. An alignment layer 82 is formed on the pixel electrode 36 and the interlayer isolating film 79 so as to contact to the liquid crystal 84. The alignment layer 82 is subjected to rubbing treatment in a predetermined direction.

On the other hand, in the opposing substrate 24, the light shielding region 19 is constructed by a light shielding film 85 which blocks out the viewing area 14. An opposing electrode 86 is formed on the light shielding film 85 and the opposing substrate 24 and an alignment layer 87 is formed on the opposing electrode 86. The alignment layer 87 is subjected to rubbing treatment in a predetermined direction.

On the other hand, the light guide plate 25 is embedded in a concave portion of the outer frame 26 in the lighting unit 22. The diffusion sheet 27 is provided on the light guide plate 25 at least in the viewing area 14 and the prism sheet 28 is provided on the diffusion sheet 27. The diffusion sheet 27 and the prism sheet 28 diffuse the light from the light guide plate 25 to emit the light on the upper side.

In the embodiment, a reflecting portion 18 is provided on the outer frame 26 and the light guide plate 25 at least in the opposing region to the light receiving element disposed area 16 of the display panel 21. A light shielding plate 18b is disposed at the light guide plate 25 side and a reflecting plate 18a is disposed at the display panel 21 side to construct the reflecting portion 18. The light shielding plate 18b prevents the light from the light guide plate 25 to proceed to the light receiving diode 17 side. The reflecting plate 18a reflects the light introduced from the observation surface side of the opposing substrate 24 and passed through the element substrate 23 to the light receiving diode 17 side. The outside light introduced into the light receiving element disposed area 16 and passed through the element substrate 23 is to be introduced to the light receiving diode 17 side. Note that the light shielding plate 18b can be omitted in the case where the light from the light guide plate 25 does not proceed to the light receiving diode 17 side according to the positional relationship between the light guide plate 25 and the light receiving diode 17.

With such a configuration, the light introduced from the observation surface side of the opposing substrate 24 through the light receiving element disposed area 16 passes the opposing substrate 24 to proceed to the element substrate 23 side. A part of the introduced light is introduced into the I type region 57 from the mask conductive layer 59 side of the upper direction of the light receiving element 17. However, light is hardly introduced into the I type region 57 from the mask conductive layer 59 side by the mask conductive layer 59 formed on the I type region 57.

Most part of the outside light passed through the opposing substrate 24 and proceeding to the element substrate 23 side passes through the element substrate 23 and proceeds on the lower side of the light receiving diode 17. The outside light passed through the element substrate 23 is reflected by the reflecting plate 18*a* provided on the lower side of the light receiving diode 17, brought back to the element substrate 23 side, and approached to the I type region 57 of the light receiving diode 17 from the lower side. Thereby sufficient outside light can be introduced into the I type region 57 of the light receiving diode 17.

A detecting current corresponding to optically generated electric charge flows in the light receiving diode 17 via a depleted layer generated in the I type region 57. The detecting current is output to an outer portion via the wires 43 and 44 connected to each of the regions 56 and 58. In this manner, the illuminance of outside light can be detected. The light from the light guide plate 25 is prevented to introduce into the light receiving diode 17 by the light shielding plate 18*b*, so that the illuminance of outside light can be surely detected by the light receiving diode 17.

By using the detected result by the light receiving diode 17, for example, brightness control of the lighting unit 22 in accordance with the brightness of outside light is possible. For example, when it is detected that outside light is bright, the brightness of the lighting unit 22 is increased in accordance with the brightness of the outside light. Thereby, visibility of display can be improved.

As described above, in the embodiment, the reflecting plate is provided on the lower side of the PIN type light receiving diode, so that even when the mask conductive layer is provided on the I type region of the light receiving diode, outside light can be introduced into the light receiving diode through the reflecting plate. That is, the illuminance of outside light can be surely detected by introducing sufficient outside light into the light receiving diode without increasing a process of removing the mask conductive layer.

In addition, a PIN type light receiving diode is provided in the region in which the element substrate and the opposing substrate are opposed, that is, in the region in which outside light can be introduced. Accordingly, a structure for introducing light into the PIN type diode can be easily established.

Figure 4:
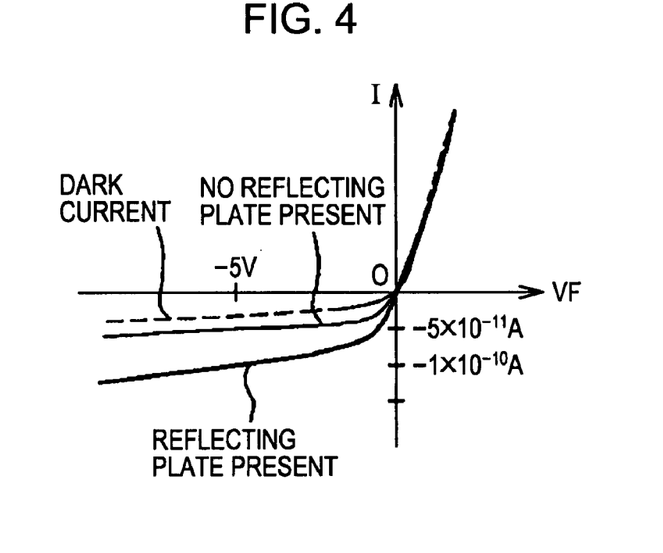
FIG. 4 is a graph showing properties of a light receiving diode in which voltage is plotted in the lateral axis and current is plotted in the vertical axis.

FIG. 4 is a graph showing properties of a light receiving diode in which voltage is plotted on the lateral axis and current is plotted on the vertical axis. The broken line shows a property (dark current property) when no light is introduced into the light receiving diode, the thin line shows a property when no reflecting plate 18*a* is provided, and the thick line shows a property when the reflecting plate 18*a* is provided in FIG. 4. Note that FIG. 4 shows properties when outside light of 10 lux is introduced when the distance between each region 56 and 58, that is, the length L of the I type region (light receiving layer length) is 8 μm, the distance W of the semiconductor layer 55 in the perpendicular direction of the paper in FIG. 3 (light receiving layer width) is 50 μm. Note that aluminum foil is used as for the example of the reflecting plate 18*a*.

The light receiving diode has optical sensitivity in the region in which current amount when light is introduced shown by the solid lines is larger than current amount when dark shown by the broken line, that is, in the region in which reverse bias voltage is applied. As shown in FIG. 4, as compared to the case where no reflecting plate 18*a* is provided, in the case where the reflecting plate 18*a* is provided, it is recognized that the difference between the current amount when light is introduced and dark current is sufficiently large. That is, in the embodiment, sufficient optical sensitivity can be obtained by the reflecting plate 18*a*.

Figure 5:
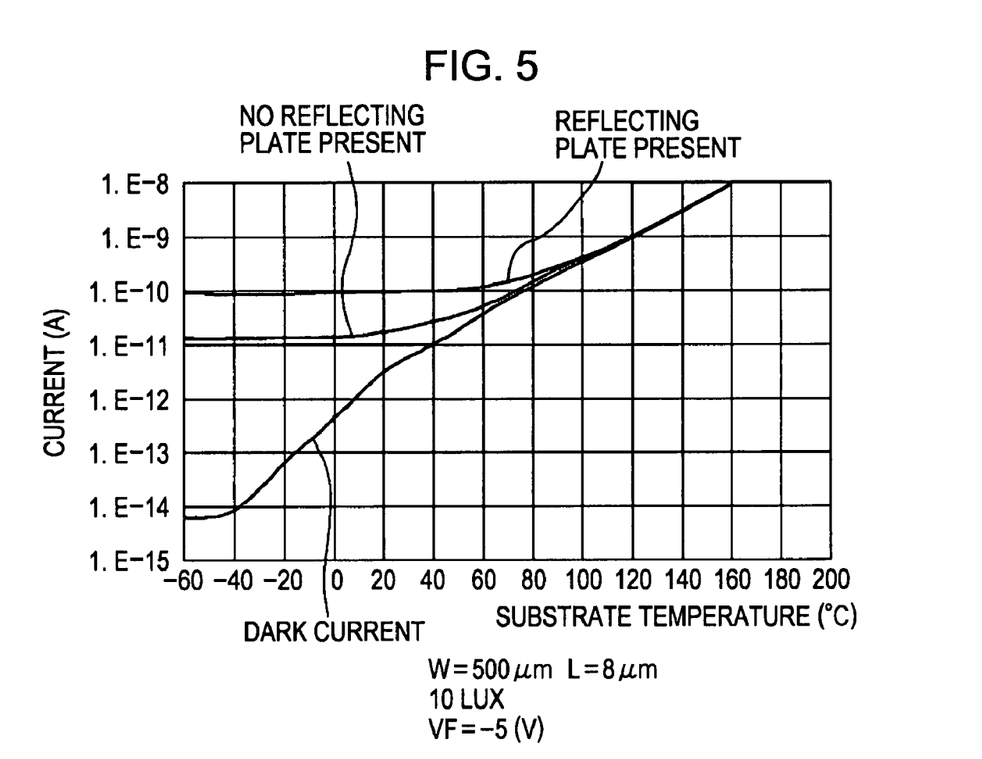
FIG. 5 is a graph illustrating dark current property in which substrate temperature is plotted in the lateral axis and sensor output (current) is plotted in the vertical axis.

Further, FIG. 5 is a graph illustrating dark current property in which substrate temperature is plotted on the lateral axis and sensor output (current) is plotted on the vertical axis. Further, FIG. 5 shows properties when the light receiving layer length L is 8 μm, the light receiving layer width W is 500 μm, reverse direction voltage of −5 V is applied, and outside light of 10 lux is introduced.

The PIN diode constituting a sensor loses optical sensitivity at a temperature not less than a predetermined temperature because thermoelectric current is increased in accordance with increase of temperature and the thermoelectric current becomes dominant. FIG. 5 shows an output (dark current) of the light receiving diode in the sate where no light is introduced and outputs (light-emitting current) of the light receiving diode when the reflecting plate 18*a* is provided and no reflecting plate 18*a* is provided. As shown in FIG. 5, when the temperature of the substrate becomes 60° C., component of the thermoelectric current becomes extremely increased in the output of each sensor.

In this case, when no reflecting plate 18*a* is provided, outside light can not be detected because the values of the dark current and the light emitting current becomes close. On the contrary, when the reflecting plate 18*a* is provided, even when the substrate temperature is 60° C., the difference between the dark current and the light emitting current can be fully ensured, so that outside light can be correctly detected. In this manner, in the embodiment, even when the substrate temperature is 60° C., dark outside light of about 10 lux can be detected. Detection threshold when aluminum film was used as the reflecting plate 18*a* was not more than 10 lux when the substrate temperature was 50° C.

Second Embodiment

Figure 6:
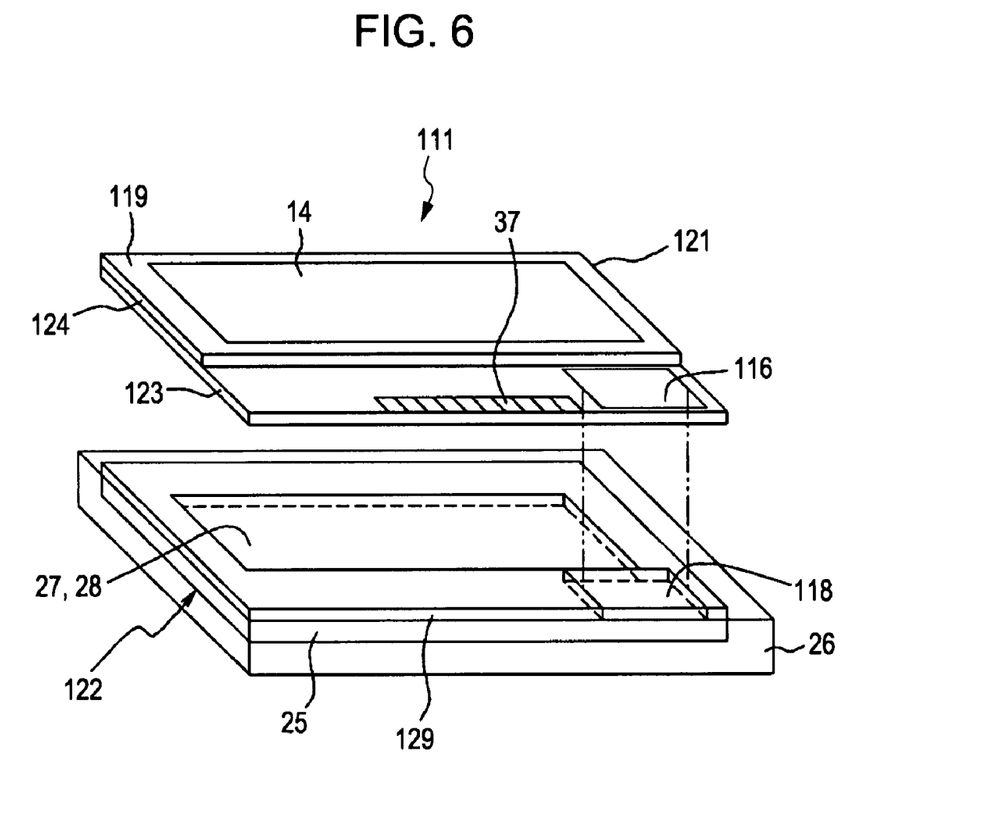
FIG. 6 is a perspective view schematically showing an electro-optical device according to a second embodiment of the invention.

FIG. 6 is a perspective view schematically showing an electro-optical device according to a second embodiment of the invention. In FIG. 6, like reference numerals are used to denote like elements in FIG. 1 and their descriptions will be omitted.

In the embodiment, only position and shape of the light receiving element disposed region and position and shape of the reflecting portion opposing the light receiving element disposed region are different from that of the first embodiment.

The electro-optical device 111 is constructed by a display panel 121 and a lighting unit 122 having the same structure as the first embodiment. An element substrate 123, an opposing substrate 124, a light shielding region 119, and a light receiving element disposed region 116 each corresponds to the element substrate 23, the opposing substrate 24, the light shielding region 19, and the light receiving element disposed region 16 of the first embodiment. The light receiving element disposed region 116 is provided in the region which is outside of the viewing area 14 and to which the opposing substrate 124 is not opposed and is provided along a part of one long side of the display panel 121. As in the case of the first embodiment, a PIN type light receiving diode is similarly provided in the light receiving element disposed region 116.

In addition, each of a light shielding plate 129 and a reflecting portion 118 constituting the lighting unit 122 corresponds to the light shielding plate 29 and the reflecting portion 18 of the first embodiment. The light shielding plate 129 is provided on a margin of the light guide plate 25 so as to surround the diffusion sheet 27 and the prism sheet 28. The reflecting portion 118 is provided at the position opposing the light receiving element disposed region 116 and the shape of the reflecting portion 118 is the same as the light receiving element disposed region 116. The reflecting portion 118 is made of, for example, a mirror, an aluminum foil, a metal plate, or the like and has a function to introduce the reflected light into the light receiving diode provided in the light receiving element disposed region 116 by reflecting the light introduced from the opposing substrate 124 side and passed through the element substrate 123.

The other configuration is the same as the first embodiment.

In the embodiment constructed in such a manner, the same effect can be obtained as the first embodiment. Further, in the embodiment, the light receiving element disposed region 116 is provided in the element substrate 123 to which the opposing substrate 124 is not opposed. That is, the light from the light guide plate 25 is not introduced into the light receiving element disposed region 116. Accordingly, the light receiving diode in the light receiving element disposed region 116 can detect outside light without suffering the influence of the light from the light guide plate. Further, as for the reflecting portion 118, the light shielding plate can be omitted.

Third Embodiment

Figure 7:
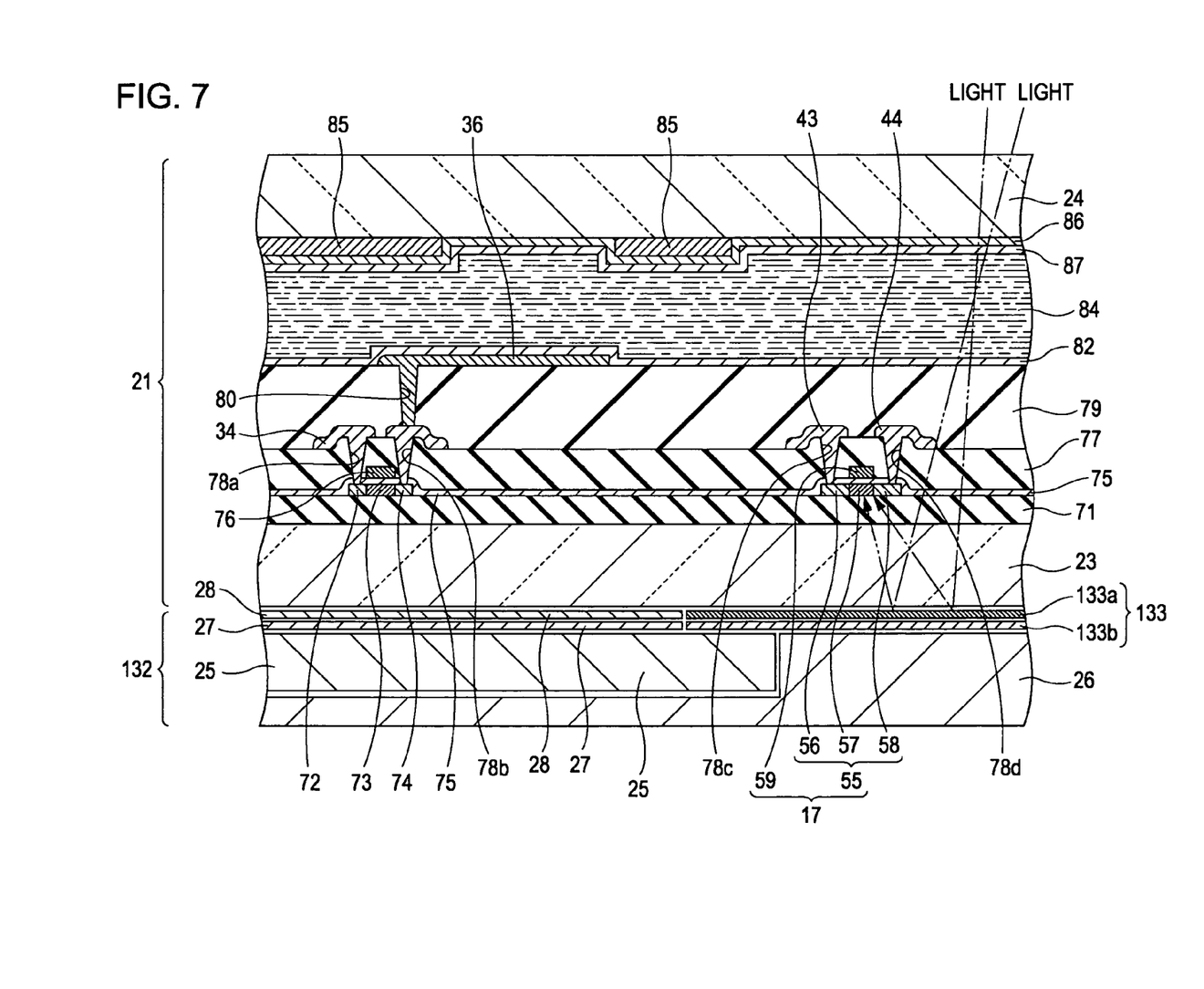
FIG. 7 is a cross sectional view schematically showing an electro-optical device according to a third embodiment of the invention.

FIG. 7 is a cross sectional view schematically showing an electro-optical device according to a third embodiment of the invention. In FIG. 7, like reference numerals are used to denote like elements in FIG. 3 and their descriptions will be omitted.

In the first embodiment, the surface of the reflecting plate is, for example, flat. In this case, the reflecting direction of the light introduced to the reflecting plate is determined by an incidence angle. Accordingly, there is a possibility that most of the introduced light is not introduced into the light receiving diode.

Accordingly, in the embodiment, by providing concavities and convexities on the surface of the reflecting plate, most of outside light is to be introduced into the light receiving diode. In the embodiment, the lighting unit 132 is different from the lighting unit 22 of the first embodiment at the point in which the reflecting portion 133 is employed instead of the reflecting portion 18.

The reflecting portion 133 has a light shielding plate 133b at the light guide plate 25 side and has a light reflecting plate 133a at the light receiving diode 17 side. The light shielding plate 133b has the same structure as the light shielding plate 18b in FIG. 3. The light reflecting plate 133a has concavities and convexities on the surface. For example, the surface of the reflecting plate 133a may be formed in a wave shape or a rough surface, that is, a shape having sufficiently small size of concavities and convexities.

In the embodiment constructed in such a manner, the light introduced from the observation surface side of the opposing substrate 24 passes through the opposing substrate 24 and the element substrate 23 to be introduced to the reflecting plate 133a. In the embodiment, the light introduced to the reflecting plate 133a is, for example, scattered, so that most of the outside light is introduced into the light receiving diode 17. Further, according to a surface shape of the reflecting plate 133a, the light introduced to the reflecting plate 133a is concentrated and introduced into the light receiving diode 17.

In this manner, in the embodiment, outside light can be effectively absorbed into the light emitting diode 17, which enables to detect outside light at further high sensitivity.

The other effects are the same as the first embodiment.

Fourth Embodiment

Figure 8:
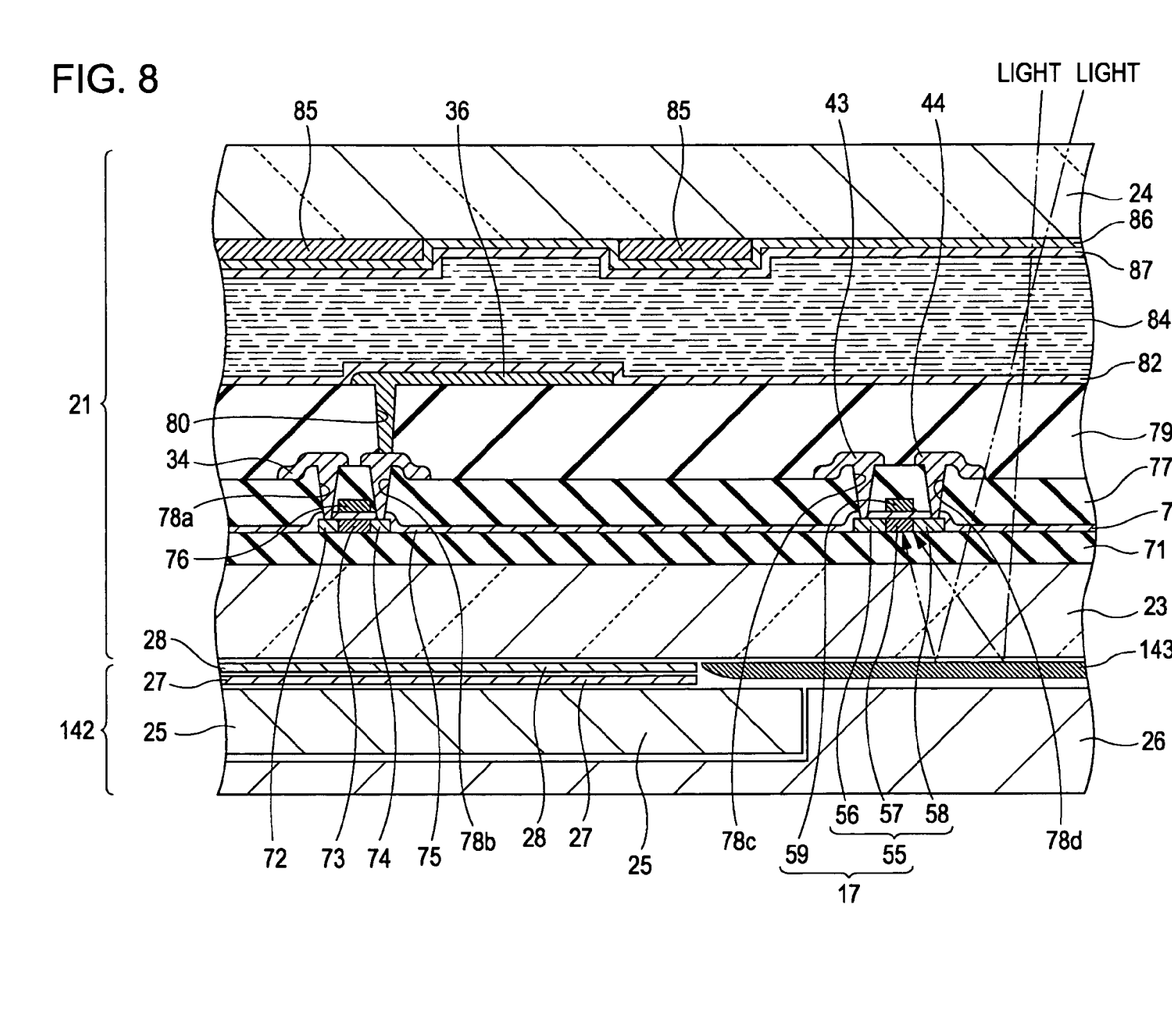
FIG. 8 is a cross sectional view schematically showing an electro-optical device according to a fourth embodiment of the invention.

FIG. 8 is a cross sectional view schematically showing an electro-optical device according to a fourth embodiment of the invention. In FIG. 8, like reference numerals are used to denote like elements in FIG. 3 and their descriptions will be omitted.

In the first embodiment, outside light passed through the element substrate is reflected to the light receiving diode side by providing the reflecting plate in the reflecting portion. On the contrary, in the embodiment, the reflecting portion is constructed by a coating material having relatively high reflectance. In the embodiment, a lighting unit 142 is different from the lighting unit 22 of the first embodiment at the point in which a reflecting portion 143 is employed instead of the reflecting portion 18.

That is, the reflecting portion 143 is made of a coating material coated on the back surface of the element substrate 23. As for the coating material, for example, white coating material having a high light reflectance ratio may be employed. Depending on the material of the coating material, sufficiently small size of concavities and convexities may be formed on the back surface of the element substrate 23. In this case, light is effectively introduced into the light receiving diode 17 by scattering the incident light.

In the embodiment constructed in such a manner, the light introduced from the observation surface side of the opposing substrate 24 is introduced to the reflecting portion 143 by passing through the opposing substrate 24 and the element substrate 23. In the embodiment, the light passed through the element substrate 23 is reflected at the back surface of the element substrate by the coating material constituting the reflecting portion 143 to be introduced into the light receiving diode 17.

In such a manner, also in the embodiment, outside light is effectively obtained by the light receiving diode 17, which enables to detect outside light at high sensitivity.

The other effects are the same as the first embodiment.

Note that, in the fourth embodiment, the reflecting portion 143 is constructed by coating a coating material on the back surface of the element substrate 23, but it is apparent that the coating material may be coated on the outer frame 26 side.

Figure 9:
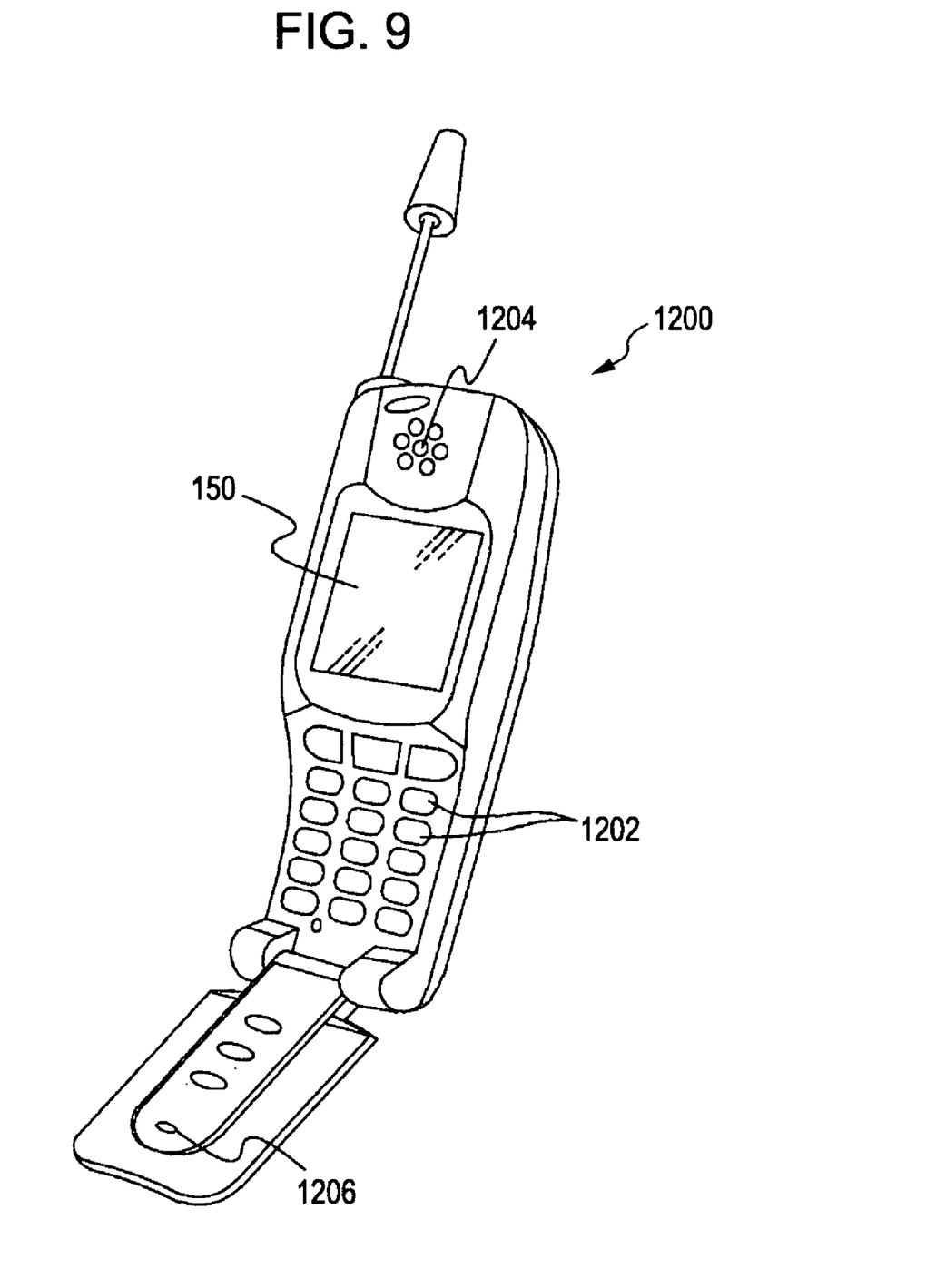
FIG. 9 is a perspective view showing an example of an electronic apparatus.

Moreover, an electronic apparatus using the electro-optical device described above is also included in the invention. FIG. 9 is a perspective view showing a configuration of a cellular phone 1200 using the electro-optical device of each of the above described embodiments.

As shown in FIG. 9, besides a plurality of manipulation buttons 1202, the cellular phone 1200 includes an earpiece 1204, a mouthpiece 1206, and a crystal liquid panel 150 described above. In the electro-optical device, the other elements except the crystal liquid panel 150 is build in the phone, so that they do not appear in appearance.

In addition, as an electronic apparatus, for example, there is a projection type display device equipped with a light source, a light bulb for modulating the light emitted form the light source, an optical system for projecting the light modulated by the light bulb. Further, as for another electronic apparatuses, a television, a view-finder-type (or monitor-direct-view-type) video recorder, a car navigation device, a pager, an electronic organizer, an electronic calculator, a word processor, a workstation, a video phone, a POS terminal, a digital still camera, an apparatus having a touch panel, and the like can be exemplified. It goes without saying that the electro-optical device according to the invention can be applied to the various electronic apparatuses.

Moreover, the electro-optical device of the invention can be applied to not only a TFT (thin film transistor) liquid crystal panel, but also to a liquid crystal panel equipped with a TFD (thin film diode) as a switching element. Further, not only to a liquid crystal panel, the invention can also be applied to a variety of electro-optical devices such as an electroluminescence device, an organic electroluminescence device, a plasma display device, an electrophoresis device, a device using electron emission (Field Emission Display, Surface-Conduction Electron-Emitter Display, and the like), a DLP (Digital Light Processing) (also known as DMD: Digital Micromirror Device), and the like.

The entire disclosure of Japanese Patent Application No. 2006-36083, filed Feb. 14, 2006 is expressly incorporated by reference herein.

What is claimed is:

1. An electro-optical device comprising:
 a display panel including a first and a second transparent substrates oppositely disposed;
 a lighting unit provided at a downside of the second transparent substrate;
 a light receiving element for detecting a luminance of an ambient light incident from an observation surface side of the first transparent substrate side; and
 a reflector that is provided at a downside of and opposing the light receiving element, the reflector to:
 (1) reflect the ambient light and introduce the ambient light to the light receiving element from the downside of the light receiving element; and
 (2) shield the light receiving element from a light of the lighting unit, the lighting unit being provided at a downside of the reflector; and
 wherein the reflector shields the light receiving element from substantially all of the light from the lighting unit.

2. The electro-optical device according to claim 1, wherein the second transparent substrate is an element substrate on which are formed a switching element, a pixel electrode, and the light receiving element.

3. The electro-optical device according to claim 2, the switching element including a semiconductor layer, the light receiving element being formed by the Same layer as the semiconductor layer.

4. The electro-optical device according to claim 1, brightness of the lighting unit being controlled by using a detected result of the light receiving element.

5. The electro-optical device according to claim 1, the light receiving element including a PIN diode, and an I type region of the PIN type diode being masked.

6. The electro-optical device according to claim 1, the reflector being provided in a frame body that holds the lighting unit.

7. The electro-optical device according to claim 1, the display panel including an effective display region defined by a light shielding film, the light shielding film having an aperture in which the light receiving element is provided.

8. The electro-optical device according to claim 1, the light receiving element being provided in a region in which the first and the second tranparent substrate are opposed.

9. The electro-optical device according to claim 1, the light receiving element being provided on the second transparent substrate, and provided in a region in which the first and the second transparent substrate are not opposed.

10. An electronic apparatus including the electro-optical device according to claim 1.

11. The electro-optical device according to claim 1, the light receiving element including a PIN diode.

12. The electro-optical device according to claim 1, the light receiving element having a first side that faces the first transparent substrate side, and a second side opposing the first side.

13. The electro-optical device according to claim 12, the reflector opposing the second side of the light receiving element.

14. The electro-optical device according to claim 1, wherein the reflector is between the light receiving element and the lighting unit.

* * * * *